United States Patent
Constancias et al.

(10) Patent No.: US 8,501,026 B2
(45) Date of Patent: Aug. 6, 2013

(54) METHOD FOR MAKING A PLANAR MEMBRANE

(75) Inventors: Christophe Constancias, Sarcenas (FR);
Bernard Dalzotto, Grenoble (FR);
Frank Fournel, Villard-Bonnot (FR);
Philippe Michallon, St Martin D'Uriage (FR); Hubert Moriceau, Saint Egreve (FR); Valerie Pouteau, Meylan (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 28 days.

(21) Appl. No.: 13/377,319

(22) PCT Filed: Jun. 17, 2010

(86) PCT No.: PCT/EP2010/058584
§ 371 (c)(1),
(2), (4) Date: Dec. 9, 2011

(87) PCT Pub. No.: WO2010/146138
PCT Pub. Date: Dec. 23, 2010

(65) Prior Publication Data
US 2012/0100719 A1 Apr. 26, 2012

(30) Foreign Application Priority Data
Jun. 18, 2009 (FR) ...................................... 09 54115

(51) Int. Cl.
*B44C 1/22* (2006.01)
*H01L 21/31* (2006.01)
*G01N 3/08* (2006.01)

(52) U.S. Cl.
USPC ................... 216/84; 216/17; 216/41; 216/56; 73/717; 73/826; 438/694

(58) Field of Classification Search
USPC ...... 216/17, 41, 56, 84; 73/717, 826; 438/694
See application file for complete search history.

(56) References Cited

U.S. PATENT DOCUMENTS

| 5,311,010 A | * | 5/1994 | Kruger | ..................... 250/214 VT |
| 6,455,429 B1 | | 9/2002 | Butschke et al. | |
| 6,563,570 B1 | * | 5/2003 | Okada | ........................... 356/35.5 |

(Continued)

FOREIGN PATENT DOCUMENTS

| EP | 0 854 358 A1 | 7/1998 |
| JP | 2001-118775 | 4/2001 |

OTHER PUBLICATIONS

French Preliminary Search Report issued Apr. 14, 2010, in Patent Application No. FR 0954115.

(Continued)

*Primary Examiner* — Shamim Ahmed
(74) *Attorney, Agent, or Firm* — Oblon, Spivak, McClelland, Maier & Neustadt, L.L.P.

(57) ABSTRACT

A method for determining a minimum tension compensation stress which will have a membrane of a thickness of less than or equal to one micrometer, secured to a frame, having, in the absence of any external stress, a desired deflection. The membrane can be made as planar as possible in absence of any external stress, and its thickness can be less than or equal to one micrometer.

13 Claims, 4 Drawing Sheets

U.S. PATENT DOCUMENTS

| | | | |
|---|---|---|---|
| 6,700,174 B1 | 3/2004 | Miu et al. | |
| 6,889,565 B2* | 5/2005 | DeConde et al. | 73/862.042 |
| 2003/0029245 A1 | 2/2003 | Izadnegahdar et al. | |
| 2006/0130588 A1* | 6/2006 | Pfeifer et al. | 73/703 |
| 2007/0054203 A1* | 3/2007 | Moriya et al. | 430/5 |
| 2008/0264172 A1* | 10/2008 | Sakurai | 73/726 |

OTHER PUBLICATIONS

Hideyuki Eguchi, et al., "Image placement of large window-size membrane for EPL and LEEPL mask", Proceedings of SPIE, vol. 5853, No. 1, XP 007912598, 2005, pp. 910-920.

B. Ghyselen, et al., "Engineering strained silicon on insulator wafers with the Smart Cut™ technology", Solid-State Electronics, vol. 48, No. 8, XP 004505229, Aug. 2004, pp. 1285-1296.

E. Bonnotte, et al., "Mise en oeuvre de deux méthodes interférométriques pour la caractérisation mécanique des films minces par l'essai de gonflement. Applications au cas du silicium monocristallin", Journal De Physique III, vol. 5, No. 7, XP 000522205, Jul. 1995, pp. 953-983.

Michelle M. Roberts, et al., "Elastically relaxed free-standing strained-silicon nanomembranes", Nature Materials, vol. 5, May 2006, pp. 388-393.

Osamu Tabata, et al., "Mechanical Property Measurements of Thin Films Using Load-Deflection of Composite Rectangular Membranes", Sensors and Actuators, vol. 20, 1989, pp. 135-141.

Stephen P. Timoshenko, et al, "Theory of Plates and Shells", McGraw-Hill Classic Textbook Reissue, Second Edition, 1959, pp. 1-580.

* cited by examiner

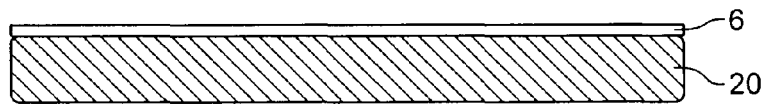
FIG.4A
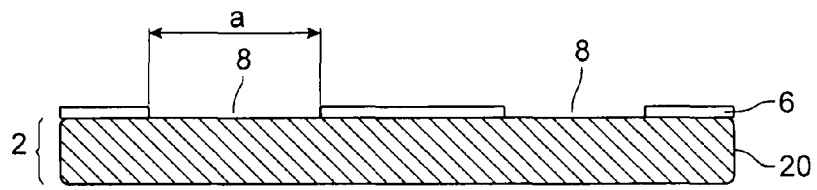
FIG.4B
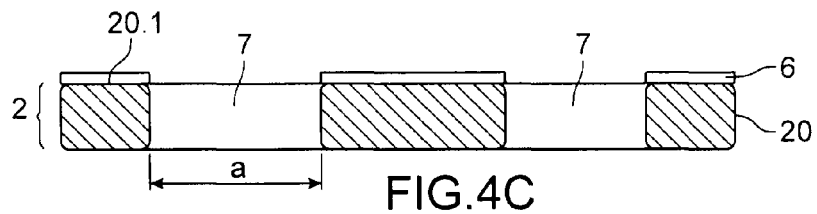
FIG.4C
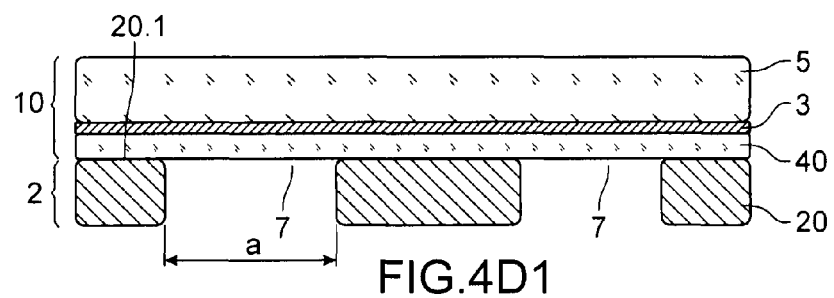
FIG.4D1
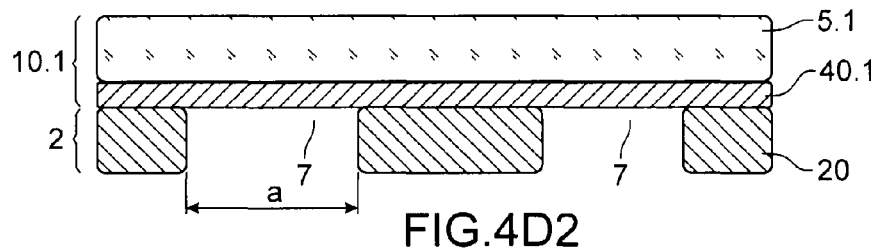
FIG.4D2

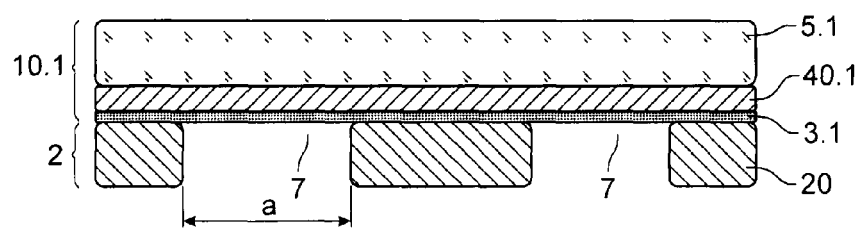
FIG.4D3
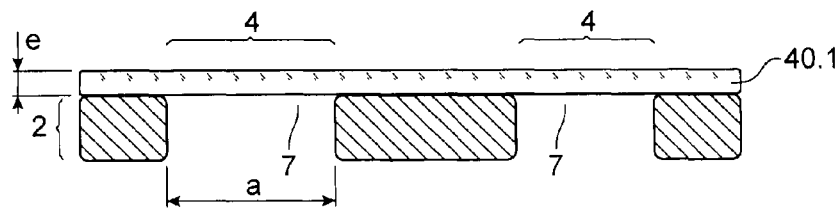
FIG.4E1
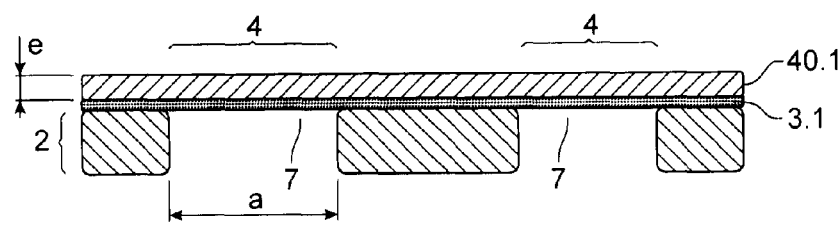
FIG.4E2
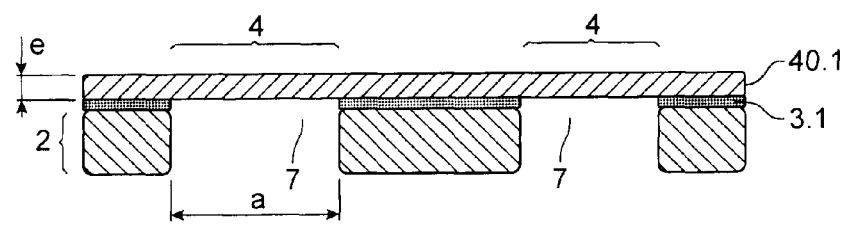
FIG.4E3

METHOD FOR MAKING A PLANAR MEMBRANE

TECHNICAL FIELD

The present invention relates to a method for making a membrane as planar as possible in the absence of any external stress. With the development of nanotechnologies, such a membrane is of particular interest if its thickness is on a nanometric scale, which means that its thickness is less than or equal to one micrometer (µm). But conditions are also to be set on its other dimensions, and difficulties appear if the membrane is of large extent. The membrane has two surface dimensions, one of which is smaller or equal to the other. The conditions on its size cause its small surface dimension to be much larger than its thickness. In other words, its surface is much larger than the square of its thickness. In the context of nanometric thicknesses, this means that the surface of the membrane is comprised between about one or more square millimeters and a few tens or hundreds of square centimeters.

Such membranes may be used in several applied fields of scientific instrumentations such as for example as a mask in lithography or in X-ray spectrometry. These applications express the need for membranes as planar as possible and with a very small thickness in order to reduce the interactions with their environment such as photons, electrons etc. In particular, in the case of uses for spectrometers, the flatness of the membranes should be to within less than 10% of the wavelength used by a spectrometer.

These membranes may also be the basis of Nano Electro-Mechanical Systems (NEMS), these are also referred to as nanosystems. The sensors may utilize during measurements the deformations of the membrane insofar that the membrane is planar or quasi-planar when it is not subject to a quantity to be detected. This may be the case for pressure sensors.

It is noted that the present invention is not limited to membranes with nanometric thickness.

STATE OF THE PRIOR ART

Methods are known for making silicon membranes for which the thickness is of the order of one micrometer. In the U.S. Pat. No. 6,455,429, one starts with a SOI (Silicon-On-Insulator) substrate for which the thinnest silicon layer has a value of a few micrometers, the thickest layer is between 500 and 600 micrometers, both of these layers being separated by an oxide layer, the thickness of which has a value from about 200 to 400 nanometers(nm). The membrane is made in the thinnest silicon layer, it is delimited by etching through a mask. A window is opened in the thickest silicon layer with stop on the oxide layer. This step is accomplished in two phases, a first etch gives the possibility of only leaving a residual silicon thickness. Etching of the silicon is accomplished by wet and/or dry chemical selective etches. Finally, the dielectric layer is removed from the window.

In Japanese patent application JP 2001-118775, an SOI substrate is made by oxidizing a first silicon substrate so as to surround it with oxide, by doping one of its oxidized faces with boron or phosphorus so as to adjust the strains on the oxide, by assembling the first substrate with another substrate so that the doped oxide layer is at the interface between both substrates. By operations for etching the substrates and for localized removal of the doped oxide layer, the membrane is made at the oxidized substrate after thinning.

The membranes obtained by both methods described earlier have acceptable flatness if their surface is not too large. On the other hand, these methods do not describe the obtaining of membranes for which the thickness is less than one micrometer. These membranes are not suitable for the applications mentioned above.

In the article <<Elastically relaxed free-standing strained-silicon nanomembranes>> Michelle M. Roberts et al., Nature Materials, Vol. 5, May 2006, pages 388-393, a method is described, aimed at making a floating membrane for which the thickness may finally be of a few tens of nanometers. One starts with an SOI substrate and a silicon germanium layer is grown on the thinnest silicon layer by epitaxy and then a surface silicon layer on the silicon germanium. It is this silicon surface layer which will eventually form the sought membrane.

A sandwich formed with the silicon germanium layer placed between two silicon layers is detached from the insulator layer of the SOI substrate. This sandwich is then released into a liquid. The thereby formed sandwich may then be transferred onto a supporting substrate for example in bulk silicon. Upon release of the sandwich from the insulating layer, the elastic relaxation of the stresses causes the silicon germanium layer to be compressively stressed and the silicon layers to be stressed in tension. The transfer of the sandwich onto the supporting substrate is not critical for controlling the stresses. The proportions of silicon and germanium in the silicon germanium layer and the thickness of the three layers of the sandwich are optimized so that the sandwich remains as planar as possible. For example, $Si_{0.84}Ge_{0.16}$ with a thickness of 128 nanometers associated with a surface silicon layer of 48 nanometers and a silicon layer from the 56 nanometers SOI base substrate is suitable for leading to a sandwich for which the flatness is acceptable in the liquid medium. But the obtained membrane is a multilayer composite membrane and this is not what is sought.

It is then possible for one skilled in the art to locally remove the supporting substrate, the silicon layer stemming from the SOI, the silicon germanium layer in order to only retain the surface silicon layer. This removal will be achieved by selective etching. However the authors of the article announce that the thicknesses and the compositions of the layers are difficult to control accurately, and the multilayer membrane forms an overthickness of the order of 300 nm to 400 nm above the supporting substrate on which the membranes are positioned.

Further, the positioning of the membrane on the supporting substrate from the liquid medium is not easy, it is not possible to select an orientation of the membrane upon depositing it on the support substrate. It may therefore be complicated to identify the positions of the membranes once they are deposited on the supporting substrate.

Further, the inventors observe that when the membranes are produced so that their thickness becomes much smaller than their surface, regardless of the known method for making them, a deflection is formed around the center of the membrane. This deflection induces deformation of the membrane which makes it unsuitable for the uses mentioned above. In particular, the uses of the DUV (deep ultra-violet) spectrometry type require changes in thickness of the membranes of less than one nanometer with membranes of a thickness comprised between a few tens of nanometers and a few micrometers and for which the smallest dimension may be millimetric or centimetric.

DISCUSSION OF THE INVENTION

The object of the present invention is precisely to propose a method for determining a minimum tension compensation stress which a membrane secured to a frame will have, without any external stress, so that its deflection is less than or equal to a desired deflection, this desired deflection being comprised between about 0.05% and 20% of its thickness.

It also has the object of proposing a method for making at least one membrane as planar as possible in the absence of any external stress, this membrane having a thickness much smaller than its surface, this membrane when it is secured to the frame, having a tension compensation stress greater than or equal to the minimum tension compensation stress defined earlier.

The inventors reckon that the deflection which they detected is due to the influence of the weight of the membrane. Thus, omitting the weight of the membrane in the calculations for designing and dimensioning the membrane leads to the making of membranes having deflection without however being subject to any external stress. Indeed, in cases where the thickness of the membrane is very small as compared with the surface of the membrane, the rigidity of the membrane is no longer sufficient for countering the effect of the weight. The influence of the weight of the membrane is then no longer negligible and there is deformation of the membrane in the form of a deflection. The deformation of the membrane is always oriented towards the ground, it changes direction when the membrane is turned over.

This consideration is counter-intuitive in micro- and nanotechnologies, where the influence of the weight of the structures is generally considered as negligible, only the residual, thermal or mechanical stresses being taken into account for predicting the deformations of the membranes and therefore their dimensioning.

The object of the present invention is therefore to propose a method for making at least one membrane in which the weight of the membrane, due to its dimensions, is taken into account but the effects of which are made to be substantially negligible.

Thus, the present invention relates to a method for making at least one membrane having a thickness much smaller as compared with its surface and more particularly less than or equal to one micrometer, which is as planar as possible, i.e. which has negligible or zero deflection, in spite of its weight, the effects of which are not negligible and which should impose a non-negligible deflection to the membrane.

By <<as planar as possible>>, is meant for example that the membrane in the absence of an external stress has a deflection of less than or equal to one nanometer for a thickness of several tens or hundreds of nanometers and a surface greater than one square millimeter. The membrane may for example have a thickness (e) comprised between a few tens of nanometers and a few hundred nanometers. More generally, this expression means that the membrane in the absence of an external stress has a deflection (h) of less than or equal to k times its thickness (e): the product k.e corresponds to an intended flatness limit which is defined by the needs for the use of the membrane. The term (k) is a constant comprised between about 0.05% and 20%, advantageously between 1% and 10%. In particular, k may be equal to 1% or 5%. The term k.e may for example have the value of 1 nm.

The theory of plates and of shells discussed by E. Bonnotte et al., in Journal of Physics III France 5 (1995) 953-983, <<Application of two interferometric methods for mechanical characterization of thin films by the inflation test. Applications to the case of monocrystalline silicon>> allows the following equation (1) to be written which establishes between the deflection h of a rectangular or square membrane which is a particular case of the rectangular membrane, with a side (a) if the membrane is square or with a width (a) if the membrane is rectangular, a relationship with its thickness (e). A pressure P is applied on the membrane. It is expressed by:

$$P = \frac{E}{1-v} \frac{e^3 h}{a^4} \left[ \frac{1}{12\beta(1+v)} + C\frac{h^2}{e^2} \right] + C^* \sigma_{residual} \frac{eh}{a^2} \quad (1)$$

E, v are Young's modulus and Poisson's coefficient of the material of the membrane, respectively, g is the acceleration of gravity (g=9.80665 m·s$^{-2}$). The membrane has a residual stress $\sigma_{residual}$. However it may happen that the residual stress $\sigma_{residual}$ is zero. β, C and C* are coefficients relating to the form factors of the membrane. These coefficients are therefore the result of calculations which depend on the geometry of the membrane, on the Poisson coefficient of the material of the membrane, on its Young modulus, on the density of its material and on the residual stress. One skilled in the art knows how to determine these coefficients by numerical simulation with suitable software packages of mechanics using the finite element method, for example the software package Ansys (registered trademark of SAP Inc., a subsidiary exclusively owned by ANSYS Inc.) or by existing analytical solutions with assumptions of simplifications, always with the aid of suitable mechanics software packages.

In particular, in the case when the membrane is square, β, C and C* are respectively such that: β=1.26.10$^{-3}$, C=C'.C$_m$, C*=13.63, C' is a constant and has the value 21.75; these values are defined at room temperature, for example of the order of 20° C.

Further, one has:

$$C_m = (C_0 - C_1 \cdot v) - (C_2 - C_3 \cdot v)\exp[-C_4 \cdot h/e] + (C_5 - C_6 \cdot e)\exp[-C_7 \cdot h/e]$$

with: $C_0$=1.41, $C_1$=0.292, $C_2$=1.64, $C_3$=1.466, $C_4$=1.4, $C_5$=0.173, $C_6$=0.00235, $C_7$=0.1.

FIG. 1 illustrates for different square-shaped membranes obtained by methods of the prior art, their deflection h versus the pressure P which is applied on them. The curve B1 corresponds to a membrane for which the side has the value 2 mm and the thickness 0.1 μm, curve B2 corresponds to a membrane for which the size has the value 3 mm and thickness 1 μm and curve B3 corresponds to a membrane for which the side has the value 5 mm and thickness 10 μm. It is noticed that the deflection increases very rapidly with pressure and that it is always much greater than the thickness of the membrane for the thinnest membrane.

In the case of very thin membranes, the inventors consider that the weight expressed by ρge, with ρ being the density of the material of the membrane, may be assimilated to a pressure P applied on the membrane. Further, in order to describe the effect produced by its own weight, it may be considered that the membrane is without any internal, residual or intentionally introduced stresses.

Thus, on the basis of equation (1), the present invention proposes a method for determining a minimum tension compensation stress of a membrane secured to a frame, in the absence of an external stress, so that its deflection is less than or equal to a desired deflection comprised between 0.05% and 20% of its thickness.

To achieve this:

a°) dimensions are selected for the membrane, i.e. a length b, a width a and a thickness e, the thickness being less than or equal to one micrometer, a material so as to have a Young modulus E and a Poisson coefficient v, a residual constraint $\sigma_{residual}$ which may be zero, a desired deflection, this desired deflection being equal to k times its thickness, k being comprised between about 0.05% and 20%.

b°) a weight P of the membrane is calculated, expressed by ρge with ρ being the density of the material of the membrane and g acceleration of gravity;

c°) the weight is applied in the following formula, by assimilating it to a pressure which is uniformly exerted on the membrane;

$$P = \frac{E}{1-v}\frac{e^3 h}{a^4}\left[\frac{1}{12\beta(1+v)} + C\frac{h^2}{e^2}\right] + C^* \sigma_{residual}\frac{eh}{a^2} \quad (1)$$

h being a calculated deflection of the membrane, β, C and C* being coefficients relating to form factors of the membrane, depending on the following quantities: length, width, thickness of the membrane, its Poisson coefficient, its Young modulus, the density of the material of the membrane and the residual stress;

d°) the coefficients β, C and C* are calculated by injecting into a suitable mechanics software package, the quantities on which they depend;

e°) the calculated deflection of the membrane is inferred from formula (1);

f°) the calculated deflection is compared with the desired deflection;

g°) if this calculated deflection is greater than the desired deflection and if the residual stress is zero, a residual tensile stress is imposed to the membrane, while if the residual stress is non-zero, it is increased so that the calculated deflection is less than or equal to the desired deflection;

h°) when the calculated deflection is less than or equal to the desired deflection, the minimum tension of the compensation stress of the membrane secured to the frame is calculated in the absence of an external stress, this minimum tension compensation stress being expressed by:

$$\sigma_0 = \frac{-E}{(1-v)}\frac{e^2}{C^*a^2}\left[\frac{1}{12\beta(1+v)} + C(k)^2\right] + \frac{\rho g a^2}{C^* k e}. \quad (2)$$

The present invention also relates to the method for making at least one membrane, for which the weight should induce, in the absence of any external stress, a deflection greater than the desired deflection and which once released in the absence of an external stress has a tension compensation stress which compensates its weight.

The method for making the membrane secured to a frame and having in the absence of any external stress, a tension compensation stress greater than or equal to the minimum tension compensation stress as determined by the method stated earlier, according to a first embodiment, comprises the following steps:

i. providing a thin layer in the selected semiconducting material stemming from an sSOI type substrate subject to a tensile stress, having the selected thickness, the substrate of the sSOI type also having, stacked with the thin layer, a thick layer in a semiconducting material and a layer in an electrically insulating material, located between the thin layer and the thick layer, said thin layer being secured to a frame provided with at least one aperture and having at the aperture the desired width and length;

ii. releasing a portion of the thin layer located at least at the aperture, by removing the layer of insulating material and the thick layer at the aperture, the thereby released thin layer portion forming the membrane;

the thin layer being selected such that it has an initial tensile stress ($\sigma_{ini}$) which verifies the following equation (3):

$$\sigma_{ini} \geq -\sigma_{oxide}\frac{e_{oxide}}{e} + \sigma_0 \quad (3)$$

wherein $\sigma_{Oxide}$ is a compressive stress exhibited by the insulating material layer of the substrate of the sSOI type, said insulating material layer having an oxide thickness $e_{oxide}$. The stress $\sigma_{Oxide}$ therefore has a negative value.

Thus, according to the conventions, a tensile stress $\sigma_{Oxide}$ will be positive and a compressive stress $\sigma_{Oxide}$ will be negative.

This first embodiment allows adjustment of the compensation stress present in the thin layer. Further it is easy to obtain substrates of the sSOI type which are compatible with the desired compensation stresses. The remainder of the method comprising etching steps which are mastered in microelectronics, such an embodiment is easy to apply industrially.

Advantageously, the method may further be such that the frame is formed by the thick layer of the substrate of the sSOI type, the formation of the aperture of the frame being accomplished by selective etching from a free face of the thick layer, with stop on the insulating material layer and the release of the membrane being accomplished by selective etching of the insulating material layer, with stop on the thin layer.

By using a selective etching technique, and by the presence of an intermediate etching layer in the form of an insulating material layer, it is possible to not etch inadvertently the thin layer both during the etching of the thick layer and of the insulating layer. Thus, the thickness and the roughness of the membrane are guaranteed.

A second embodiment of the method according to the invention is based on a different approach for building the frame and for introducing the tension compensation stress into the membrane.

The method for making a membrane secured to a frame, having, in the absence of any external stress, a tension compensation stress greater than or equal to the minimum tension compensation stress determined by the method stated earlier, according to this second embodiment, comprises the following steps:

i. providing a stack of a thin layer and of a base substrate, the thin layer having the selected thickness and being in the selected material, ii. assembling the thin layer to a frame provided with at least one aperture and having at the aperture, the selected width and length, the frame being formed by an additional substrate provided with the aperture, the thin layer covering the aperture, iii. releasing a portion of the thin layer located at least at the aperture, by removing the base substrate at the aperture, the thereby released thin layer portion forming the membrane. During the assembling, the thin layer is brought to a film temperature Tf and the frame to a frame temperature Tc below the film temperature. The film temperature and the temperature of the frame are different, which imposes a thermal expansion difference between the thin layer and the frame.

This thermal expansion difference is such that it induces into the thin layer, after assembly, during equalization of the temperatures of the thin layer and of the frame, for example to the temperature of the frame Tc, a thermal tensile stress greater than or equal to the minimum tension compensation stress. The thin layer is therefore brought to a film temperature Tf greater than the temperature of the frame Tc so that once it has adhered to the frame, the thin layer reaches the temperature of the frame Tc without being able to retract, whence the tensile condition. The temperature of the thin layer may be obtained by bringing the stack to the film temperature Tf.

In this second embodiment, the temperature difference during the assembling is such that it induces in the thin layer, a tensile stress greater than or equal to the minimum tension compensation stress required for counterbalancing the effects of the weight of the membrane.

The stack may be formed with a substrate of the SOI type, including a thin layer in a semiconducting material as a thin layer, a thick layer in a semiconducting material and a layer in an electrically insulating material as a base substrate, the layer in electrically insulating material being between the thin layer and the thick layer.

Alternatively, the stack may include a thin metal layer as a thin layer and a base substrate. The thin metal layer may be placed between the base substrate and an oxide layer. The release step then further includes an operation for removing the oxide from the aperture.

With this method, it is possible to obtain membranes subject to tensile stresses, therefore having minimized deflection, without however depending on substrates of the sSOI type.

The method according to this second embodiment of the invention further allows better control of the stresses present in the membrane and gives the possibility of avoiding deep etching steps. The latter may be delicate in terms of selectivity and etching uniformity.

Further, with this method, it is possible to avoid the presence of the layer of insulating material between the membrane and the frame, which is not possible in the first embodiment. Therefore there is no need to counterbalance the stresses from interface and edge effects which occur because of this layer in insulating material. The compensation stress to be applied to the membrane may therefore be less substantial than in the first embodiment for membranes with the same surface dimensions and same thickness.

According to a first advantageous alternative, the thin layer has a thermal expansion coefficient of a thin layer ($\alpha_{t1}$) and the frame has a thermal expansion coefficient of the frame ($\alpha_{frame}$) substantially equal to that of the thin layer. For example, the thin layer may be formed in the same material as the frame. The thermal expansion of the assembly, after assembling and releasing the membrane, is then substantially identical for the membrane and the frame. The compensation stress present in the membrane is then constant as a function of any temperature of use of the frame/membrane assembly and the flatness of the membrane is ensured for all the temperatures of use of the membrane, greater than, less than or equal to the temperature of the assembly.

Further, in a second advantageous alternative, non-exclusive of the previous alternative, the stack has a stack thermal expansion coefficient ($\alpha_{SOI}$) greater than the thermal expansion coefficient of the frame ($\alpha_{frame}$). For example, in the case of a stack of the SOI substrate type, the frame and the thin layer may be formed with silicon and the thick layer of the SOI type substrate may be formed with germanium or SiGe. This difference in the thermal expansion coefficients gives the possibility of minimizing the required difference in temperatures between the substrates in order to guarantee, during the assembling, the compensation stress $\sigma_0$ in the thin layer.

Finally, in a third advantageous alternative, the stack thermal expansion coefficient ($\alpha_{SOI}$) and the thermal expansion coefficient of the frame ($\alpha_{frame}$) are substantially equal to the thin layer thermal expansion coefficient ($\alpha_{t1}$). The relationship between the thermal stress in the membrane and the temperatures of the assembly is simplified.

In this case, determination of the temperatures to be used during the assembling is facilitated. The difference between the film temperature (Tf) of the thin layer and the temperature of the frame (Tc) is such that during the assembling, the following equation (4) is verified:

$$T_f - T_c \geq \frac{\sigma_0 \cdot (1-\nu)}{E \cdot \alpha} \quad (4)$$

$\alpha$ being the thermal expansion coefficient of the frame.

In this embodiment, the aperture with which the additional substrate is provided, is preferentially a through-aperture.

In the method according to the invention, a tension compensation stress is introduced into the membrane. This stress is obtained without handling the released membrane, and without modifying the physico-chemical condition of the membrane. Indeed, there is neither introduction of doping elements, nor addition of a layer covering the membrane.

SHORT DESCRIPTION OF THE DRAWINGS

The present invention will be better understood upon reading the description of given exemplary embodiments, purely as an indication and by no means as a limitation, with reference to the appended drawings wherein.

Figure 2A:
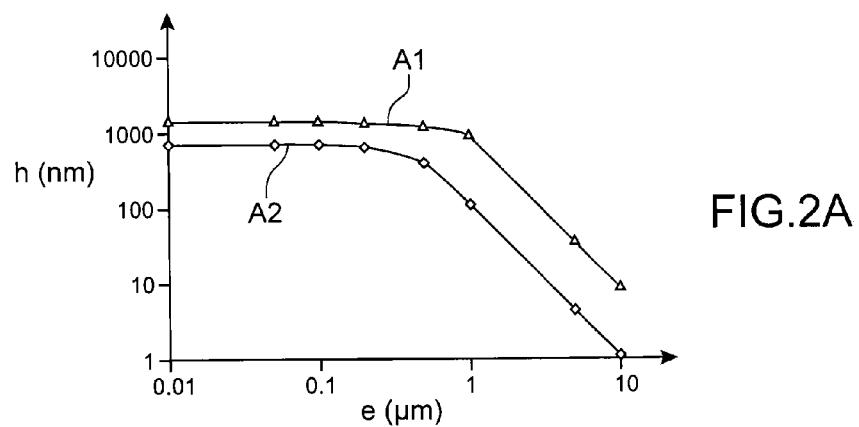
FIG. 2A illustrates the influence of the weight of a membrane on the deflection of the membrane as a function of the thickness of the membrane.
Figure 2B:
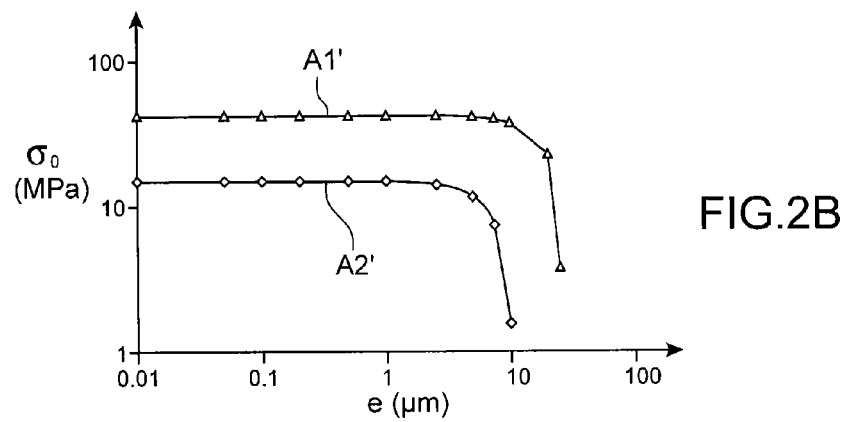

FIG. 2B indicates the theoretical compensation stress $\sigma_0$ to be introduced into a membrane in order to obtain a deflection of less than or equal to 1 nm, as a function of the surface and of the thickness of the membrane;

FIGS. 3A-3E illustrate steps of a first embodiment of the method according to the invention;

FIGS. 4A-4C, 4D1, 4D2, 4D3, 4E1, 4E2, 4E3 illustrate steps of several alternatives of a second embodiment of the method according to the invention.

The different described alternatives have to be understood as not being exclusive of each other.

Identical, similar or equivalent parts of the different figures bear the same numerical references so as to facilitate switching from one figure to the other.

The different parts illustrated in the figures are not necessarily illustrated according to a uniform scale, in order to make the figures more legible.

DETAILED DISCUSSION OF PARTICULAR EMBODIMENTS

A method according to the invention aims at producing one or several membranes as planar as possible. By as planar as possible is meant that the membrane has, in the absence of an external stress, a deflection of less than or equal to a desired deflection $h_{desired}$ having a value k times the thickness e of the membrane, k being a percentage comprised between about 0.0% and 20%, advantageously between 1% and 10%. This may then be referred as k % flatness. In particular k may be for example equal to 1% or 5%. The product k.e will be designated as the limiting flatness value. It may for example have the value 1 nm.

It is sought to more particularly make a membrane 4 having a thickness less than or equal to 1 micrometer and with a surface area of more than 1 square millimeter, for example 3×3 mm² or 5×5 mm². This membrane is illustrated in FIG. 3 or 4. In the following of the description, it is assumed that the targeted limiting flatness value k.e is 1% of the thickness, but it is quite obvious that other limiting flatness values for the membrane 4 may be selected depending on the intended applications for the membrane. The product k.e then has to be replaced in the equations with the selected limiting value and the expression <<k times the thickness of the membrane>> in the text has to be replaced with the expression of the selected limiting value. This selected or desired deflection $h_{desired}$ is comprised between about 0.05% and 20% of its thickness.

One begins by selecting the dimensions of the membrane, i.e. its thickness e which is less than or equal to 1 micrometer, its length b and its width a. The desired deflection $h_{desired}$, i.e. the coefficient k, is also selected. The material of the membrane, for example silicon, is also selected. The Young modulus E of the material of the membrane and the Poisson coefficient ν of the material of the membrane are then known. In particular, for silicon, E=130 GPa and ν=0.28.

It may also be imposed that the membrane has a residual either tensile or compressive stress $\sigma_{residual}$. This residual stress may be zero.

The weight P of the membrane is calculated. It is conventionally expressed by ρge with ρ being the density of the material of the membrane, g is the acceleration of gravity.

The weight of the membrane is assimilated to a pressure P which is uniformly exerted on the membrane.

The pressure which is exerted on the membrane is expressed by the expression (1) already seen above:

$$P = \frac{E}{1-v} \frac{e^3 h}{a^4}\left[\frac{1}{12\beta(1+v)} + C\frac{h^2}{e^2}\right] + C^* \sigma_{residual} \frac{eh}{a^2} \quad (1)$$

h is the calculated deflection of the membrane, β, C and C* are coefficients relating to form factors of the membrane, depending on the dimensions of the membrane, length, width, thickness, on its Poisson coefficient, on its Young modulus E, on the density of its material and on the residual stress. These coefficients β, C and C* are unknown. So they have to be calculated. Reference may be made to the article of E. Bonnotte, page 966. For a square membrane, the ratio b/a has the value 1. For a membrane having a deflection much less than its thickness, the calculation of the coefficient β was explained by Timoshenko S. in his textbook <<Théorie des plaques et coques>> (Plate and Shell Theory) Librairie polytechnique (1961) as mentioned in the article of E. Bonnotte on page 976. The values of the coefficients C and C* are given in the article of E. Bonnotte on page 976. They are derived from studies of O. Tabata et al. published in Sensors and Actuators, (1989) 135.

In order to obtain these coefficients, the length b, the width a, the thickness of the membrane, its Poisson coefficient ν, its Young modulus E, the density ρ of the material of the membrane and the residual stress $\sigma_0$ are injected into a suitable mechanics software package for example using the finite element method. The package delivers these coefficients β, C and C*.

Once the coefficients β, C and C* are calculated, it is sufficient to draw the calculated deflection h from the expression (1) in order to see whether it is smaller than or equal to the desired deflection.

If the calculated deflection is greater than the desired deflection, and the residual stress is zero, a residual tensile stress is imposed to the membrane so that the calculated deflection is less than or equal to the desired deflection. If the residual stress is non-zero, it is increased so that the calculated deflection is less than or equal to the desired deflection. If the residual stress was a compressive stress, by increasing it, it is transformed into a tensile stress. If the residual stress was a tensile stress, it is also increased and it remains a tensile stress.

When the calculated deflection is less than or equal to the desired deflection, the minimum tension compensation stress of the membrane attached on a frame is calculated, in the absence of any external stress. The minimum tension compensation stress is expressed by:

$$\sigma_0 = \frac{-E}{(1-v)} \frac{e^2}{C^* a^2}\left[\frac{1}{12\beta(1+v)} + C(k)^2\right] + \frac{\rho g a^2}{C^* k e} \quad (2)$$

Experiment shows that the value of this minimum compensation stress is comprised between 10 and 100 MPa for a membrane with a thickness less than or equal to one micrometer with surface areas of a few square millimeters.

A first method for making a membrane with a thickness less than or equal to one micrometer, having a tension compensation stress greater than or equal to the minimum tension compensation stress obtained by the method described earlier, will now be described.

Figure 3A:
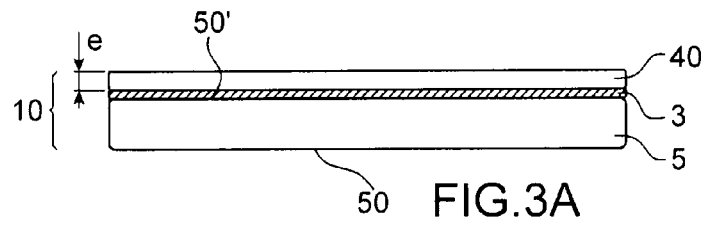

The membrane will be obtained from a thin layer 40 provided on a substrate 10 of the sSOI type stressed in tension as illustrated in FIG. 3A. By definition, a substrate of the SOI type, includes a layer in an electrically insulating material 3, comprised between a thin layer 40 of thickness e, in a semiconducting material, advantageously in silicon, and a thick layer 5, advantageously in a semiconducting material. The material of the thin layer is the one which was selected in the method for determining the minimum tension compensation stress. The thick layer 5 includes two main faces, one of the faces, referenced as 50', is in contact with the layer in insulating material 3 and the other face 50 is free. The layer in insulating material 3 is advantageously in an oxide, for example in silicon oxide. In the sSOI substrate, it is the thin layer which is stressed in tension and this stress is known.

Figure 3B:
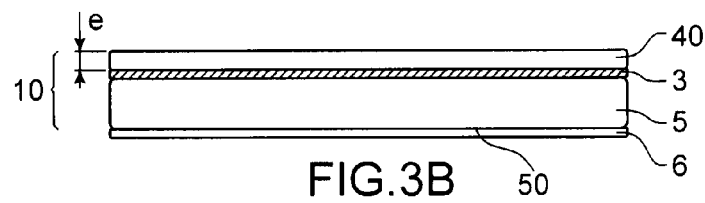
Figure 3C:
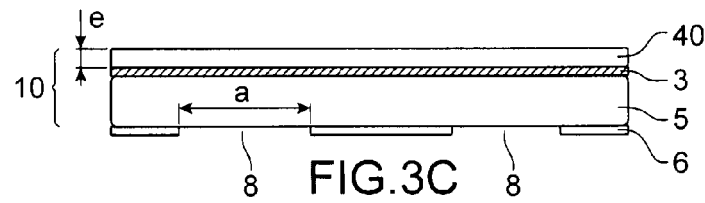
Figure 3D:
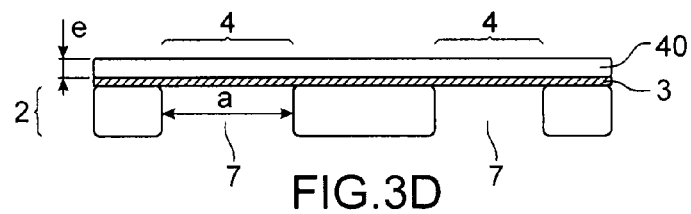
Figure 3D:
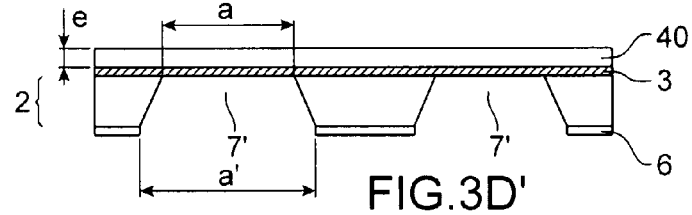
Figure 3E:
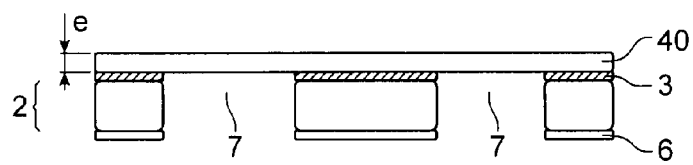

Such a membrane 4 is illustrated for example in FIG. 3E. The membrane 4 is a portion of the thin layer 40, secured with a frame 2. The object of the method according to the invention is to form at least one membrane which, without any external stress, is subject to a minimum compensation tensile stress $\sigma_0$ capable of a countering a deformation due to its own weight. In FIG. 3E, the membrane 4 is secured to the frame 2 via a discontinuous layer in insulating material 3.

Indeed, the membrane with thickness (e) which the method of the invention aims to make, if it is not subject to the compensation stress because of its dimensions, would be such that its weight would substantially induce in a central area, in combination with interface and edge stresses, a deflection greater than the intended limiting flatness value, for example greater than 1% of its thickness (e).

Interface stresses are present, in particular in the case when the frame/membrane assembly is formed with several different materials or when other layers are present at this interface.

They are considered in a first approximation as residual compressive stresses in the thin layer.

The membrane 4 obtained by the method of the invention has two surface dimensions in the plane of the thin layer 40, one of which, called width a, is less than or equal to the other one b. The membrane has a deflection of less than or equal to a desired flatness limit, or desired deflection, i.e. k times its thickness e.

Its width verifies the following equation:

$$a \geq \left\{ \frac{E}{1-\nu} \frac{e^3(k)}{\rho g} \left[ \frac{1}{12\beta(1+\nu)} + C \cdot (k)^2 \right] \right\}^{1/4}$$

E, ν, ρ respectively being Young's modulus, Poisson's coefficient and the density of the semiconducting material forming the thin layer 40, g being the acceleration due to gravity, β, C and C* being coefficients relating to form factors and described above.

This equation gives the width a of a membrane of a given thickness e for which its own weight would induce, excluding any internal stress, and without any external stress, a deflection of more than k times its thickness e.

Examples of membranes concerned by the method according to the invention may be square membranes with a surface of 5 mm×5 mm, having a thickness e greater than or equal to 1 μm, or square membranes with a surface of 3 mm×3 mm, having a thickness smaller than or equal to 1 μm. The curves A1, A2 of FIG. 2A illustrate the change in the deflection h of membranes from the prior art, due to their own weight, versus their thickness e. Curve A1 corresponds to a square membrane with a side of 5 mm and curve A2 to a square membrane with a side of 3 mm. It is seen therein that the membranes described above, without any external stress, have deflections of more than 1% of their thickness.

Such membranes would have a deflection of more than 1 nm if their thickness was less than 10 μm for the membrane with a side of 3 mm, respectively less than 14 μm for the membrane with a side of 5 mm.

Alternatively, the method according to the invention may relate to membranes having a deflection of more than 1% of their thickness, i.e. for square membranes with a side of 3 mm or 5 mm, membranes with a thickness of less than 1 μm or 10 μm respectively.

Thus, in order to avoid the formation of a deflection of more than k times the thickness of the membrane, the method according to the invention induces at least the minimum tension compensation stress $\sigma_0$ calculated earlier, into the membrane 4, in order to counterbalance its own weight.

FIG. 2B gives the compensation stress $\sigma_0$, in MPa, which has to be introduced into the membrane obtained by the method of the invention in order to obtain a deflection h less than or equal to 1 nm depending on the thickness e of the membrane expressed in micrometers. These results are obtained for two square membranes with a side of 3 mm (curve A2') or with a side of 5 mm (curve A1'). Thus, it is observable thereon in both cases that in order to have a deflection of less than or equal to 1 nm, it is necessary to apply compensation stresses close to 14 MPa or 40 MPa, in tension, for any membrane for which the thickness is respectively less than 1 μm or 4 μm. This FIG. 2B also illustrates that, from a critical value, here 1 μm and 4 μm respectively, the compensation stress $\sigma_0$ to be introduced into the membrane in order to counter its own weight and obtain a deflection of less than 1 nm may substantially be assimilated to a constant. For example, a compensation stress greater than or equal to 15 MPa guarantees flatness to 1 nm for square membranes with a surface area of less than or equal to 3 mm×3 mm, regardless of the thickness of the membrane. This is true as long as it is less than the critical tension beyond which the membrane may tear. Indeed, one skilled in the art is aware of the physical limitations of thin films and will seek not to impose in the membranes, by means of the method according to the invention, compensation stresses greater than the elastic limits of the membranes.

Without any minimum tension compensation stress, i.e. with $\sigma_0=0$, the weight of the membrane induces a deflection which attains and exceeds 1 micrometer when the thickness of the membrane is less than or equal to a few hundred nanometers. A silicon membrane of a few square millimeters, with a thickness of less than 500 nanometers, has, in the absence of an external stress, a deflection of more than 100 nanometers, which is unacceptable for an optical application.

In the case of a silicon square membrane with a side of 3 mm, in the absence of internal stresses of the membrane, the deflection of the membrane induced by its own weight is 0.68 μm. In order to reduce this deflection to 1 nm, a tensile stress of 15.1 MPa has to be applied to it. Also for a square membrane with a side of 5 mm, in the absence of any internal stresses in the membrane, the deflection of the membrane induced by its own weight is 1.40 μm. In order to reduce this deflection to 1 nm, a tensile stress of 41.9 MPa has to be applied to it.

Again, reference is made to FIGS. 3A-3E. One therefore starts from the substrate 10 of the sSOI type stressed in tension. It is illustrated in FIG. 3A. Here, the stress of the thin layer 40 is a tensile stress $\sigma_{ini}$.

In the method of the invention, according to the first embodiment, the deflection imposed to the membrane due to its own weight will be countered by the compensation stress formed by the initially present stress in the thin layer 40 of the sSOI substrate 10 which will give the membrane 4.

However, because of the method for forming the sSOI substrate 10, the layer in insulating material is generally subject to a compressive stress $\sigma_{oxide}$. This compressive stress $\sigma_{oxide}$, may be due to interface and edge effects. It may have a large value of more than 10 MPa, and even larger, or even larger than 1 GPa. A standard value is for example 300 MPa.

Thus, in the method according to the invention according to the first embodiment, in order that the minimum tension compensation stress in the membrane verifies equation (2), the existing compressive constraint $\sigma_{oxide}$ existing in the layer of insulating material 3 and being found at the interface with the thin layer 40 is compensated. Therefore the initial tensile stress $\sigma_{ini}$ present in the thin layer 40 has to be greater than or equal to a sum of the minimum tension compensation stress $\sigma_0$ required for counterbalancing the weight of the membrane, and of the stress required for counterbalancing the compressive stress $\sigma_{oxide}$ at the interface. Thus in the substrate 10, of the sSOI type, selected in the method of the invention according to the first embodiment, the tensile stress $\sigma_{ini}$ of its thin layer 40 is such that equation (3) is verified:

$$\sigma_{ini} \geq -\sigma_{oxide} \frac{e_{oxide}}{e} + \sigma_0 \tag{3}$$

wherein $e_{oxide}$ represents the thickness of the layer in insulating material 3 and $\sigma_{oxide}$ is expressed as a stress. $\sigma_{oxide}$ is therefore negative as it is a compressive stress.

The sSOI substrate 10 may therefore be selected with, in the thin layer 40, a tensile stress of more than 10 MPa, and even greater than 1 GPa. Typical values may for example be 435 MPa or 450 MPa. In particular, the stress induced in the thin layer 40 by the stress present in the layer in insulating material 3 may be of the order of 30 MPa or 40 MPa.

Once the sSOI substrate 10 is determined, a mask material layer 6 is deposited on the free face 50 of its thick layer 5 (FIG. 3B). A photolithographic step, comprising a step for depositing resin, an insolation step, a step for removing the resin according to the insolation and a step for etching the mask in the area(s) without resin, then take place in order to form at least one etching area 8 (FIG. 3C).

Next, after a step for removing the resin, in the etching area 8, it is proceeded with etching of the material of the thick layer 5, through the free face 50 with stop on the insulating material layer 3. (FIG. 3D). A frame 2 is thereby formed, consisting of the thick layer 5, this frame 2 has at least one aperture 7 which in this case is a through-aperture. In the case when the material of the thick layer 5 is silicon, etching may be chemical etching and may occur by exposing it to an aqueous solution of KOH (potassium hydroxide) or TMAH (tetramethylammonium hydroxide). At the aperture 7, the area of the exposed insulating material layer 3 has the predicted dimensions a and b, so that equation (2) is verified.

In the case when the thick layer 5 is in a monocrystalline semiconducting material, the etching may be anisotropic and preferentially accomplished along planes non-perpendicular to the main faces of the sSOI substrate 10. Reference is made to FIG. 3D'. The aperture referenced as 7' then has walls which flare from the insulating material layer 3 towards the free face 50 of the thick layer 5. The dimension a, at the insulating material layer 3, becomes a' at the free face 50 of the thick layer 5, with a' greater than a. The same applies for the other dimension b, b', but this is not illustrated. The dimensions of the etching area 8 and therefore of the aperture 7 are therefore selected in order to obtain the intended dimensions at the exposed insulating material layer 3.

Advantageously, the remaining etching mask 6 may then be removed (FIG. 3E).

Next, by another etching step, the exposed insulating material at the aperture 7 is removed so as to expose the material of the thin layer 40 and to thereby release the membrane 4 at the aperture 7 (FIG. 3E). In the method according to the first embodiment of the invention, this step is accomplished by etching, preferably anisotropically, all or part of the portions of the layer in insulating material 3, not covered by the thick layer 5, with stop on the thin layer 40. The etching may be wet etching with hydrofluoric acid for example.

Both of the aforementioned etching steps are advantageously selective etchings.

Another embodiment of the method of the invention is illustrated in FIGS. 4A-4E3.

In the method according to the second embodiment of the invention, one starts with a stack 10 including a base substrate 5 and 3 and a thin layer 40, the thin layer 40 having to form the membrane. The expression <<thin layer>> was used in order to mean that its thickness is less than that of the base substrate. In the first example according to this second embodiment, the stack is a substrate of the SOI type. Reference is made to FIGS. 4A-4C, 4D1, 4E1. The frame 2 is formed in an additional substrate 20. The thin layer 40 of the SOI substrate will form the membrane and it is in the material selected in the method for determining the compensation stress. Its thickness is also the one selected to be less than or equal to 1 micrometer. This additional substrate 20 is preferentially in a semiconducting material and advantageously consists of the same material as the thin layer 40 present on the substrate 10 of the SOI type.

At least one aperture 7 will be formed in the additional substrate 20. It is preferably a through-aperture.

For this, it is possible to define at least one etching area 8 in a mask material 6. This is accomplished by depositing a mask layer 6 on one of the main faces of said additional substrate 20 (FIG. 4A). The mask material 6 may be any material known to one skilled in the art for forming etching masks.

Next, a photolithographic step takes place. The latter may include i.a. a step for depositing resin, a step for insolation of the resin, a step for partial removal of the resin depending on the insolation, a step for etching the mask in order to form the etching area 8 and a step for removing the remaining resin (FIG. 4B).

Alternatively, the step for depositing the masked material 6 may not be carried out, in which case, the aperture will be etched in the additional substrate 20 directly, through the area opened in the resin, by using a selective etching method with respect to the resin. Thus, the step for removing the resin only occurs after the etching of the aperture.

The additional substrate 20 is therefore pierced with at least one aperture 7 through the etching area in the mask material or the resin (FIG. 4C). In the case illustrated in FIG. 4C and the following figures, several apertures 7 are illustrated but it is possible to only form a single one. This piercing may be accomplished by chemical etching or by machining or by laser cutting. In the case when the additional substrate 20 is in silicon, it may be etched by means of an aqueous solution of TMAH or KOH. The pierced additional substrate 20 forms a frame 2 over which the thin layer 40 may be tensioned, as this will be described later on. In the example described by FIGS. 4A-4E, it is assumed that the piercing takes place by chemical etching.

In the second embodiment of the method according to the invention, the aperture 7 advantageously crosses entirely the additional substrate 20 (FIG. 4C). At one at least of the main faces of the additional substrate 20, whether the piercing is isotropic or not, the aperture 7 has two dimensions a and b which are those selected during the method for determining the minimum tension compensation stress, since they correspond to the dimensions a and b of the membrane which is being formed. Said face of the additional substrate 20, referenced as 20.1, meeting this condition will then be designated as the active face 20.1 of the frame 2.

Figure 1:
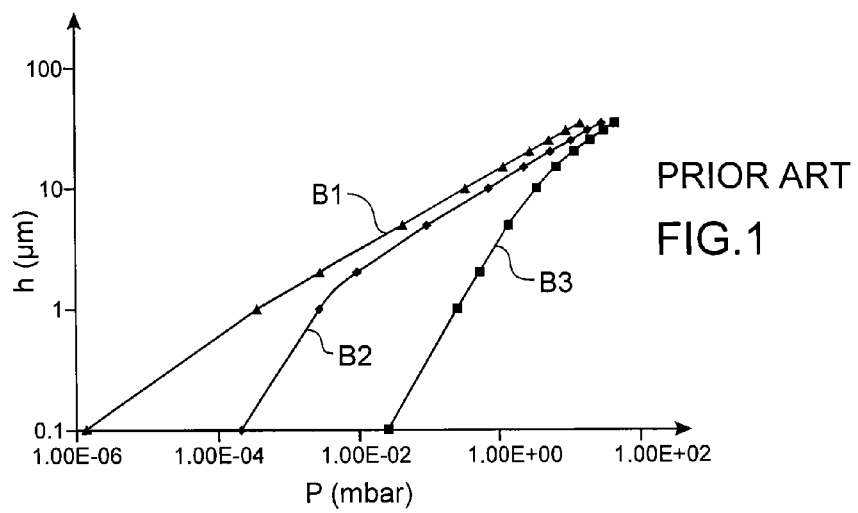
FIG. 1 (already described) illustrates in the case of membranes obtained by the methods of the prior art, the change in their deflection as a function of the pressure which is applied on them.

The material having been used as a mask, either the mask material 6, or the resin layer, may then be removed (FIG. 4D1). In the case when the mask material is present on the active face 20.1 of the frame 2, this material layer is necessarily removed after etching the aperture 7. FIG. 4C illustrates this configuration.

The piercing step may be followed by a step for preparing the active face 20.1 of the frame 2 for the assembly which follows.

After forming the frame 2, the active face 20.1 of the frame 2 is assembled to the stack 10 by putting it into contact with the thin layer 40 of the stack (FIG. 4D1), the stack here being a substrate of the SOI type. This may in particular be accomplished by means of molecular, preferentially hydrophobic adhesive bonding. The thin layer 40 covers the aperture 7. A cavity is then formed at each aperture 7. In FIG. 4D, the thin layer 40 of the substrate 10 of the SOI type will obturate a side of the aperture 7.

During the assembling between the additional substrate 20 and the stack, the thin layer is brought to a temperature Tf and the frame 2, formed in the additional substrate 20 is brought to a frame temperature Tc, less than or equal to the film temperature Tf.

The different layers to be assembled being brought to different temperatures, different thermal expansions occur. Upon returning the assembly obtained by the assembling, to thermal equilibrium, in particular after the step for releasing the membrane 4, described hereafter, the expansions are resorbed, the thin layer 40 having to undergo greater contraction than the frame 2. However, as it is attached to the frame 2, the thin layer 40 cannot contract sufficiently and undergoes a thermal stress $\sigma_{Tf\text{-}Tc}$ related to the contraction difference of the layers set into play.

In the method according to the invention, the frame Tc and the film Tf temperatures of the assembling step are selected so that the thermal stress $\sigma_{Tf\text{-}Tc}$ induced in the thin layer 40 is a tensile stress greater than or equal to the minimum tension compensation stress $\sigma_0$, thus verifying equation (2) and counterbalancing the effect of the weight of the membrane.

The additional substrate 20 has a thermal expansion coefficient of the frame $\alpha_{frame}$, and the stack has a stack thermal expansion coefficient called $\alpha_{SOI}$. The thin layer 40 has a thermal expansion coefficient $\alpha_{t1}$.

The actual stress present in the membrane 4 during use of the membrane depends on the temperature of the frame Tc also equal to the assembling temperature, on a temperature of use Tu of the membrane and on expansion coefficients of the frame 2 and of the thin layer 40.

Several cases are then to be considered depending on whether the thermal expansion coefficient of the frame $\alpha_{frame}$ is greater than or less than the thin layer thermal expansion coefficient $\alpha_{t1}$ and on whether the temperature of use Tu is greater than or less than the temperature of the frame Tc. One skilled in the art may select the conditions which are best suited to his/her application:

according to a first possibility, the temperature of use Tu is greater than the assembling temperature Tc: it is preferable to select the thin layer 40 and the frame 2 such that the thermal expansion coefficient of the frame $\alpha_{frame}$ is greater than or equal to the thermal expansion coefficient of the thin layer $\alpha_{t1}$. Upon passing from the assembly temperature Tc to the temperature of use Tu, the tensile stress in the membrane is then greater than or equal to the thermal stress $\sigma_{Tf\text{-}Tc}$ formed during the assembling.

according to a second possibility, the temperature of use Tu is less than the assembling temperature Tc: it is preferable to select the thin layer 40 and the frame 2 such that the thermal expansion coefficient of the frame $\alpha_{cadre}$ is less than or equal to the thin layer thermal expansion coefficient $\alpha_{t1}$. Upon passing from the assembling temperature Tc to the temperature of use Tu, the tensile stress in the membrane is then greater than or equal to the thermal stress $\sigma_{Tf\text{-}Tc}$ formed during the assembling.

In both these cases, the compensation stress formed by the method of the invention in the membrane varies depending on the temperature of use Tu.

In a first advantageous alternative, the frame, and the materials making it up, is selected so as to have a thermal expansion coefficient substantially equal to that of the thin layer.

Since the thermal expansion coefficients are substantially equal for the membrane 4 and the frame 2, the flatness of the membrane 4 is ensured for all the temperatures of use of the membrane, greater than, less than or equal to the assembling temperature Tc.

Preferentially, the frame 2 consists of the same material as that of the thin layer 40, for example silicon. Tensioned membranes on a frame are thereby obtained at an assembling temperature Tc, the frame/membrane assembly being in a single material.

Subsequently a case will be considered wherein the thin layer is in a material different from the frame.

The thermal stress may be expressed as a function of the thermal expansion coefficients $\alpha_{SOI}$, $\alpha_{t1}$ and $\alpha_{cadre}$, of the temperatures at the moment of the assembling and of a common temperature at which the frame, the stack (SOI substrate) and the thin layer are found after assembling.

During the assembling, the common temperature of a frame/membrane assembly is imposed by the frame 2 since its volume is significantly greater than that of the membrane 4. This volume difference actually has orders of magnitude close to a factor of 1,000, while the differences in the thermal expansion coefficients differ at most by a factor 10 or 100: for example $0.5 \cdot 10^{-6}$ K$^{-1}$ for quartz and $2.6 \cdot 10^{-6}$ K$^{-1}$ for silicon. The temperature of the assembling may therefore to the first order be assimilated to the temperature of the frame Tc.

Also, the expansion of the thin layer 40 at the temperature Tf, and therefore the expansion difference between the frame 2 and the thin layer 40 during the assembling, essentially depends on the expansion of the stack, therefore of the substrate 10 of the SOI type at this temperature. The expansion of the thin layer during the assembling therefore depends on the thermal expansion coefficient $\alpha_{SOI}$ of the stack. In particular, this expansion depends on a thermal expansion coefficient associated with the thick layer 5, the thermal expansion coefficient of a substrate of the SOI type which may to the first order be assimilated to that of said thick layer and more generally to that of the base substrate if this is not the case of a substrate of the SOI type as this will be seen later on.

Thus, to the first order, the thermal stress $\sigma_{Tf\text{-}Tc}$ depends on $\alpha_{SOI}$, $\alpha_{frame}$ and on the temperatures of the frame Tc and of the thin layer Tf.

According to this simplification, in a second advantageous alternative, the frame 2, and the substrate 10 of the SOI type, are selected so that the thermal expansion coefficient of the frame $\alpha_{frame}$ is less than the thermal expansion coefficient of the substrate 10 of the SOI type, $\alpha_{SOI}$. This difference in the thermal expansion coefficients allows minimization of the temperature difference $\Delta T$, during the assembling between both substrates 10, 20, required for guaranteeing the compensation stress $\sigma_0$ in the thin layer 40. Indeed, in this case, a given temperature difference $\Delta T$ leads to a larger expansion difference between the substrates 10, 20 and therefore to a larger thermal stress $\sigma_{Tf\text{-}Tc}$ than in the case when the thermal expansion coefficients $\alpha_{frame}$ and $\alpha_{SOI}$ are equal.

For example, it is possible to use a frame 2 in silicon and a substrate 10 of the SOI type, the thickest layer 5 of which is in germanium or SiGe, or a frame 2 in SiO$_2$ and a substrate 10 of the SOI type based on silicon.

It is possible to combine this second advantageous alternative with the first advantageous alternative, wherein the thermal expansion coefficient of the frame $\alpha_{frame}$ is substantially equal to the thin layer thermal expansion coefficient $\alpha_{t1}$. This may be achieved by selecting a thin layer 40 having a thermal expansion coefficient substantially equal to the one of the frame 2. This thin layer is initially present on a substrate 10 of the SOI type, the thickness layer 5 of which has a thermal expansion coefficient greater than that of the frame 2. In an example of this advantageous assembly, it is possible to select a frame 2 in silicon onto which is assembled a thin silicon layer 40. This is the surface layer of a substrate 10 of the SOI type, the thick layer 5 of which is in germanium or SiGe, i.e. a substrate of the Si/SiO$_2$/Ge substrate type.

According to a third advantageous alternative, compatible with the first alternative and not compatible with the second alternative, the substrate 10 of the SOI type and the additional substrate 20, or the materials with which they are formed, are selected such that the thermal expansion coefficients of the substrate 10 of the SOI type, $\alpha_{SOI}$, those of the frame 2, $\alpha_{frame}$, and of the thin layer, $\alpha_{t1}$, are substantially equal. This alternative has the advantage of simplifying the definition of the thermal stress formed in the thin layer 40 as used in this description. It then may be given by the following equation (5):

$$\sigma_{Tf-Tc} = (T_f - T_c)\frac{E \cdot \alpha}{(1-v)} \quad (5)$$

with α, being the thermal expansion coefficient of the frame 2. In particular, for silicon, the thermal expansion coefficient α has the value $4.10^{-6}$ K$^{-1}$, E, Young's modulus, has the value 130 GPa and ν, Poisson's coefficient has the value 0.28. For silicon, this leads to a thermal stress close to 0.7 MPa/K. (Tf-Tc) is positive since Tf is a temperature above Tc.

In this third advantageous alternative, the determination of the temperatures to be used during the assembling is facilitated. They are selected so as to verify the equation (4):

$$T_f - T_c \geq \frac{\sigma_0 \cdot (1-v)}{E \cdot \alpha} \quad (4)$$

Further, as in the case of the first advantageous alternative, the membrane/frame assembly has a substantially uniform thermal expansion coefficient and the thermal stress formed in the membrane 4 is constant for any temperature of use and may be adjusted to the required compensation stress.

After the assembling step by molecular bonding, it is proceeded with an annealing step for strengthening the bond.

Next, in the method according to the second embodiment of the invention, the base substrate i.e. in this example the layer in an insulating material 3 and the thick layer 5 are removed (FIG. 4E1). This removal is accomplished at least at each aperture. This allows release of the membrane(s) 4, at each aperture 7 of the frame 2. This may be accomplished by mechano-chemical polishing or by abrasion or by chemical etching. Advantageously, at least the final part of the removal of the thick layer 5 is achieved by etching via a chemical route with stopping on the layer in insulating material 3. Advantageously, removal of the insulating material layer 3 is accomplished by chemical etching with stopping on the thin layer 40.

This second embodiment, according to the first example, allows, by suppressing the presence of the layer in insulating material 3 in the final device, an improvement in controlling the stresses present in the membrane 4.

A second example of the second embodiment will now be described. There is no change for making the frame 2, reference is made to FIGS. 4A-4C described earlier.

For the membrane, one starts with a stack 10.1 comprising at least one thin layer 40.1 and a base substrate 5.1. The thin layer 40.1 will form the membrane. Reference is made to FIG. 4D2. The thin layer 40.1 may be in a semiconducting material, in a metal material or in an electrically insulating material. What is important is that this thin layer has a surface condition, a flatness and a surface chemistry compatible with the transfer onto the frame on the one hand and with the characteristics desired for the membrane once it is released, on the other hand.

With silicon or silicon oxide, the surface conditions are under control. In the example which we propose to describe, the thin layer 40.1 is metal, for example in aluminum or in platinum. The base substrate 5.1 is for example in silicon, in glass, in quartz, in sapphire. The thin layer 40.1 may be deposited by evaporation on the base substrate 5.1.

The active face 20.1 of the frame 2 is assembled to the stack 10.1 by putting it into contact with the thin layer 40.1 (FIG. 4D2). It is proceeded as described earlier for the conditions relating to the frame and film temperatures.

The base substrate 5.1 is then removed. This step is not illustrated, the structure obtained is similar to the one illustrated in FIG. 4E1, except for the fact that the thin layer is now metal.

Alternatively, it is possible that the stack further includes an oxide layer which covers the thin layer 40.1, for example silicon oxide. This oxide layer is illustrated in FIG. 4D3 with reference 3.1. The thin layer is located between the oxide layer and the base substrate. The thickness of the oxide layer may be of a few tens of nanometers. It is used for improving the quality of the bonding interface. The stack assembled to the frame 2 is illustrated in FIG. 4E2, the base substrate having been removed. During the release of the membrane, the oxide layer 3.1 is also removed at the apertures 7. This may be accomplished with hydrofluoric acid HF. Reference may be made to FIG. 4E3.

All what has been mentioned relating to the thermal expansion coefficients during the description of FIGS. 4A-4C, 4D1, 4E1 is applied to this second example in which the stack includes a thin layer, a base substrate and an oxide layer.

Although two embodiments of the present invention have been illustrated and described in a detailed way, it will be understood that different changes and modifications may be brought thereto without departing from the scope of the invention.

The invention claimed is:

1. A method for determining a minimum tension compensation stress ($\sigma_0$) with which is provided a membrane having a thickness of less than or equal to one micrometer, secured to a frame, having, in the absence of an external stress, a desired deflection (desired h) equal to k times its thickness (e) with k comprised between about 0.05% and 20% of its thickness wherein:
   a) dimensions for the membrane, including a length b, a width a and its thickness e, a material so as to have a Young modulus E and a Poisson coefficient ν, a residual stress $\sigma_{residual}$ which may be zero, and the desired deflection, are selected;
   b) a weight of the membrane is calculated, expressed by ρge with ρ being the density of material of the membrane and g the acceleration of gravity;
   c) the weight is applied in the following formula (1), by assimilating it to a pressure which is uniformly exerted on the membrane, $$P = \frac{E}{1-v}\frac{e^3 h}{a^4}\left[\frac{1}{12\beta(1+v)} + C\frac{h^2}{e^2}\right] + C^*\sigma_{residual}\frac{eh}{a^2} \quad (1)$$

h being a calculated deflection of the membrane, β, C and C* being coefficients relating to form factors of the membrane, depending on the following quantities: length, width, thickness of the membrane, its Poisson coefficient, its Young modulus, density of the material of the membrane and residual stress;
   d) the coefficients β, C and C* are calculated by injecting into a suitable mechanics software package, the quantities on which they depend;

e) the calculated deflection h of the membrane is inferred from formula (1);
f) the calculated deflection is compared with the desired deflection;
g) if this calculated deflection is greater than the desired deflection, and if the residual stress is zero, a residual tensile stress is imposed to the membrane, while if the residual stress is non-zero, it is increased so that the calculated deflection is less than or equal to the desired deflection;
h) when the calculated deflection is less than or equal to the desired deflection, the minimum tension compensation stress of the membrane secured to the frame in the absence of an external stress is calculated, this minimum tension compensation stress being expressed by equation (2):

$$\sigma_0 = \frac{-E}{(1-v)} \frac{e^2}{C^*a^2} \left[ \frac{1}{12\beta(1+v)} + C(k)^2 \right] + \frac{\rho g a^2}{C^*ke}. \quad (2)$$

2. A method for making a membrane secured to a frame and having, in the absence of any external stress, a tension compensation stress greater than or equal to the minimum tension compensation stress determined by the method according to claim 1, comprising:
i) providing a thin layer in the selected semiconducting material, having the selected thickness, stemming from a substrate of sSOI subject to a tensile stress, the substrate of sSOI also having, stacked with the thin layer, a thick layer in a semiconducting material and a layer in an electrically insulating material, located between the thin layer and the thick layer, said thin layer being secured to a frame provided with at least one aperture and having, at the aperture, the selected width and length;
ii) releasing a portion of the thin layer located at least at the aperture, by removing the layer of insulating material and the thick layer at the aperture, the thereby released thin layer portion forming the membrane, the thin layer is selected so that it has an initial tensile stress ($\sigma_{ini}$) which verifies the following equation (3):

$$\sigma_{ini} \geq -\sigma_{oxide} \frac{e_{oxide}}{e} + \sigma_0 \quad (3)$$

wherein $\sigma_{oxide}$ is a compressive stress expressed as a stress exhibited by the layer of insulating material of the substrate of sSOI, said layer of insulating material having an oxide thickness $e_{oxide}$.

3. The method according to claim 2, wherein the frame is formed by the thick layer of the substrate of sSOI, the formation of the aperture of the frame being accomplished by selective etching from a free face of the thick layer, with stop on the layer of insulating material, and a release of the membrane being accomplished by selective etching of the layer of insulating material with stop on the thin layer.

4. A method for making a membrane secured to a frame and having, in the absence of any external stress, a tension compensation stress greater than or equal to the minimum tension compensation stress determined by the method according to claim 1, comprising:

i) providing a stack of a thin layer and of a base substrate, the thin layer having the selected thickness and being in the selected material;
ii) assembling the thin layer to a frame provided with at least one aperture and having, at the aperture, the selected width and length, the frame being formed by an additional substrate provided with the aperture, the thin layer covering the aperture;
iii) releasing a portion of the thin layer located at least at the aperture, by removing the base substrate at the aperture, the thereby released thin layer portion forming the membrane, during the assembling, the thin layer being brought to a film temperature Tf and the frame to a frame temperature Tc below the film temperature, the film temperature and the temperature of the frame being different, which imposes a thermal expansion difference between the thin layer and the frame, inducing in the thin layer after assembly, during equalization of the temperatures of the thin layer and of the frame, a thermal tensile stress ($\sigma_{Tf-Tc}$) greater than or equal to the minimum tension compensation stress ($\sigma_0$).

5. The method according to claim 4, wherein the thin layer has a thin layer thermal expansion coefficient ($\alpha_{tl}$) and the frame has a thermal expansion coefficient of the frame ($\alpha_{frame}$) substantially equal to that of the thin layer.

6. The method according to claim 5, wherein the thin layer is formed in the same material as the frame.

7. The method according to one of claim 4, wherein the stack is formed with a substrate of SOI, including a thin layer in semiconducting material as a thin layer, a thick layer in semiconducting material and a layer in electrically insulating material between the thin layer and the thick layer, the thick layer and the layer in electrically insulating material forming the base substrate.

8. The method according to claim 7, wherein the frame and the thin layer are formed in silicon and the thick layer of the substrate of SOI is formed in germanium or in SiGe.

9. The method according to claim 2, wherein the stack includes a metal thin layer and a base substrate.

10. The method according to claim 9, wherein the stack further includes an oxide layer, the metal thin layer being between the base substrate and the oxide layer.

11. The method according to claim 10, wherein the release step further includes a step for removing the oxide layer from the aperture.

12. The method according to claim 4, wherein the stack has a stack thermal expansion coefficient ($\alpha_{SOI}$) and the frame has a thermal expansion coefficient of the frame ($\alpha_{frame}$) less than the stack thermal expansion coefficient $\alpha_{SOI}$.

13. The method according to claim 4, wherein the thin layer has a thin layer thermal expansion coefficient ($\alpha_{tl}$), the frame has a thermal expansion coefficient of the frame ($\alpha_{frame}$) and the stack has a stack thermal expansion coefficient ($\alpha_{SOI}$) substantially equal to the thermal expansion coefficients of the frame and of the thin layer, the difference between the film temperature (Tf) and the temperature of the frame (Tc) being such that during the assembling, the following equation is verified:

$$T_f - T_c \geq \frac{\sigma_0 \cdot (1-v)}{E \cdot \alpha}$$

$\alpha$, being the thermal expansion coefficient of the frame.

* * * * *